(12) United States Patent
Liu et al.

(10) Patent No.: US 7,362,179 B2
(45) Date of Patent: Apr. 22, 2008

(54) POWER AMPLIFIER CIRCUIT AND METHOD THEREOF

(75) Inventors: Jung-Chang Liu, Taipei (TW); Che-Hung Liao, Taipei (TW); Sen-You Liu, Taipei (TW); Did-Min Shih, Milpitas, CA (US)

(73) Assignee: Via Technologies Inc., Taipei (TW)

( * ) Notice: Subject to any disclaimer, the term of this patent is extended or adjusted under 35 U.S.C. 154(b) by 200 days.

(21) Appl. No.: 11/336,261

(22) Filed: Jan. 19, 2006

(65) Prior Publication Data

US 2006/0164168 A1    Jul. 27, 2006

Related U.S. Application Data

(60) Provisional application No. 60/646,258, filed on Jan. 24, 2005.

(51) Int. Cl.
*H03F 3/04* (2006.01)

(52) U.S. Cl. .................. 330/296; 330/285

(58) Field of Classification Search ............. 330/285, 330/296
See application file for complete search history.

(56) References Cited

U.S. PATENT DOCUMENTS 6,784,748 B1 *  8/2004  Canyon et al. .......... 330/296
7,129,786 B2 * 10/2006  Kim et al. ................ 330/296

\* cited by examiner

*Primary Examiner*—Khanh Van Nguyen
(74) *Attorney, Agent, or Firm*—Thomas, Kayden, Horstemeyer & Risley (57) ABSTRACT

A power amplifier circuit amplifying an input signal to an output signal and a method thereof. The power amplifier circuit comprises a ramp controller, a current source, and a first amplification stage. The ramp controller receives an enable signal to generate a ramp signal. The current source is coupled to the ramp controller, produces a ramp current by the ramp signal. The first amplification stage is coupled to the current source, comprises a first supply voltage input coupled to a fixed supply voltage, and is biased by the ramp current to amplify the input signal such that an envelope of the output signal is a ramp.

14 Claims, 6 Drawing Sheets

POWER AMPLIFIER CIRCUIT AND METHOD THEREOF

CROSS-REFERENCE TO RELATED APPLICATION

This application claims priority of U.S. provisional application entitled "POWER AMPLIFIER RAMP UP/DOWN CIRCUIT," assigned Ser. No. 60/646,258, filed Jan. 24, 2005, and incorporated herein by reference, in its entirety.

BACKGROUND OF THE INVENTION

1. Field of the Invention

The invention relates to a power amplifier, and in particular to a power amplifier circuit and method thereof.

2. Description of the Related Art

Spectrum usage in technology and telecommunication industries is typically governed by a spectrum regulator such as the Federal Communications Commission (FCC) for transmission power over a particular spectrum to manage interference and spectrum shortage.

In practice, a sharp change in signal envelope amplitude usually exerts frequency components outside the regulated power spectrum. This phenomenon is known as "spectral spatter", referring to the frequency "spattering" beyond its intended spectrum boundaries. Spectral spatter is usually not desirable, since it not only produces undesirable interference on adjacent spectra, but also is energy inefficient.

Various efforts have been made to reduce the spectral spatter, such as applying a filter to remove excess frequency components. However, a filter may not effectively remove undesired frequency components, and attenuates the magnitude of spectrum in use. Another attempt focuses on power amplifier circuit with ramp control. This approach retards the amplitude variation of signal envelope. Whenever the ramp circuit experiences an abrupt change at its input, it delivers a gradually inclining signal transition to the power amplifier. Consequently the power amplifier follows the inclining signal transition to output a progressive slanted signal envelope, whereby the excess frequency components are suppressed.

Figure 1:
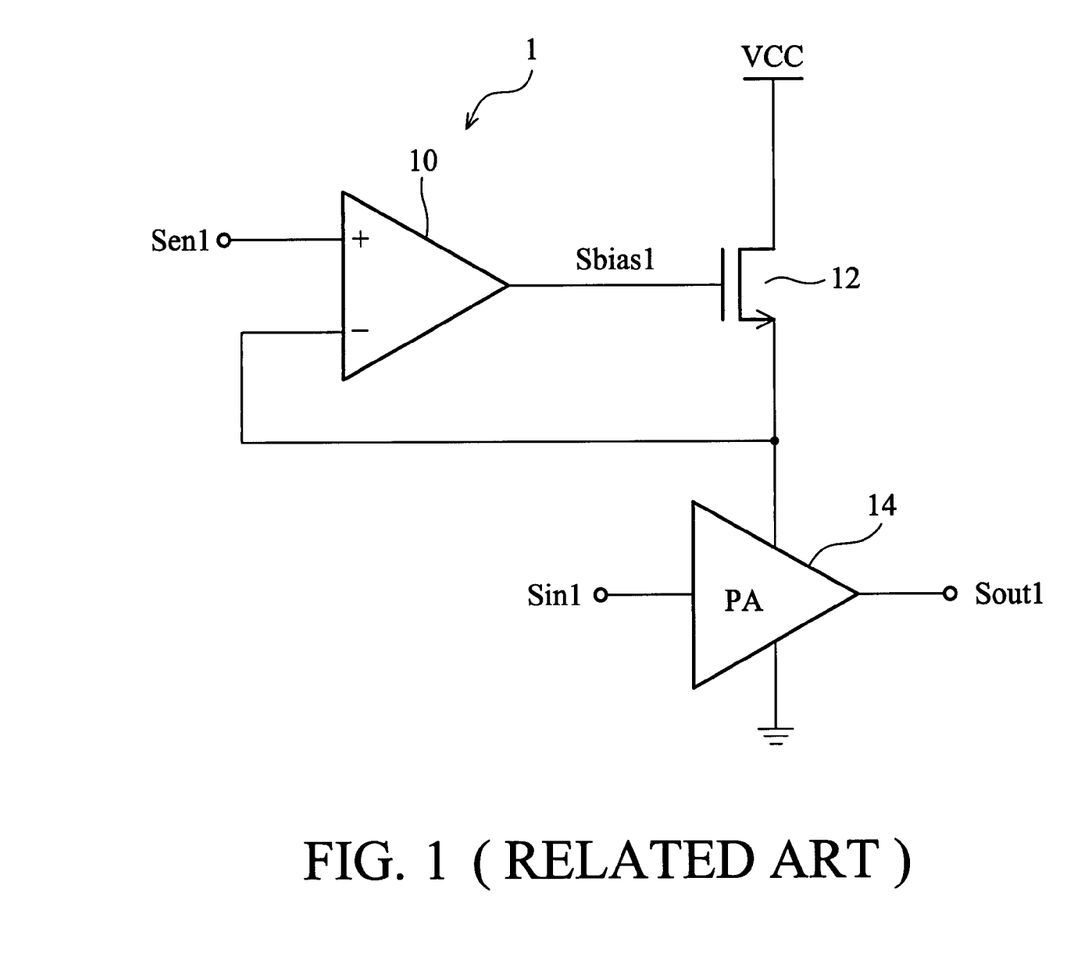
FIG. 1 is a block diagram of a conventional power amplifier circuit.

FIG. 1 is a block diagram of a conventional power amplifier circuit with ramp control, comprising operational amplifier (OA) 10, MOS 12, and power amplifier (PA) 14. The output of OA 10 is coupled to the gate of MOS 12, the inverting input of OA 10 is coupled to the drain of MOS 12 and a supply power input of PA 14.

When the conventional power amplifier circuit is required to amplify input signal Sin1 to output signal Sout1, the non-inverting input of OA 10 receives enable signal Sen1 from logic "low" to logic "high", such that the output of OA 10 generates a bias voltage to turn MOS 12 on, rendering the supply voltage at the supply voltage input of PA 14. The supply voltage is also fedback to the inverting input of OA 10, so that as the voltage difference between the inverting and non-inverting inputs of OA 10 decreases, the bias voltage decreases accordingly, leading to a ramp voltage to the supply voltage input of PA 14. Consequently PA 14 amplifies input signal Sin1 by a variable gain corresponding to the ramp voltage from the supply voltage input, and generates output voltage Sout1 with a ramp envelop.

Although the conventional power amplifier circuit provides ramp control capability, it also presents inherent circuit deficiency. Firstly, PA 10 in the conventional power amplifier circuit increases circuit complexity. Secondly, power consumption in MOS 12 causes ineffective power utilization. Thirdly, the supply voltage to PA 14 cannot complete a full VCC swing since there is a finite voltage drop across MOS 12. Finally, the device size of MOS 12 has to be large to withstand a large driving current, consuming more circuit area and increasing manufacturing cost.

In addition, the power amplifier circuit is also required to control the initialization of the ramp bias signal. If the input signal arrives at the power amplifier after the ramp bias signal reaches a maximal or minimal value the spectral spatter can still be present in the output signal. As a result a programmable delay can be incorporated into the power amplifier circuit such that the ramp bias signal is synchronous with the input signal.

Thus it is desirable to have a power amplifier circuit capable of ramp control and programmable delay control.

BRIEF SUMMARY OF THE INVENTION

A detailed description is given in the following embodiments with reference to the accompanying drawings.

According to the invention, a power amplifier circuit amplifying an input signal to an output signal is provided, comprising a ramp controller, a current source, and a first amplification stage. The ramp controller receives an enable signal to generate a ramp signal. The current source is coupled to the ramp controller, produces a ramp current by the ramp signal. The first amplification stage is coupled to the current source, comprises a first supply voltage input coupled to a fixed supply voltage, and is biased by the ramp current to amplify the input signal such that an envelope of the output signal is a ramp.

According to another embodiment of the invention, a method of amplifying an input signal to an output signal is also provided, comprising receiving an enable signal to generate a ramp signal, producing a ramp current by the ramp signal, coupling a first supply voltage input of a first amplification stage to a fixed supply voltage, and biasing the first amplification stage with the ramp current such that an envelope of the output signal is a ramp.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 2:
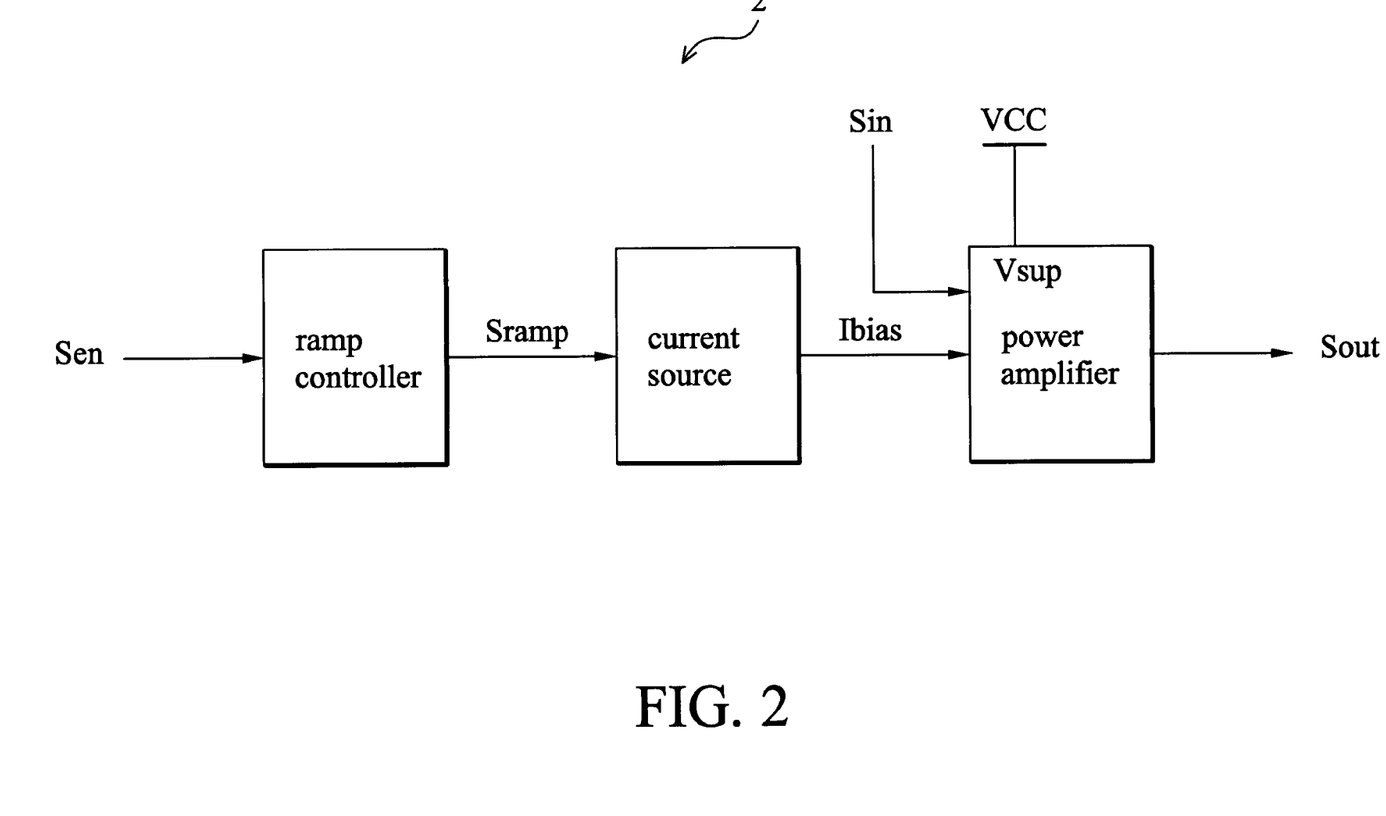
FIG. 2 is a block diagram of an exemplary power amplifier circuit of the invention.

FIG. 2 is a block diagram of an exemplary power amplifier circuit of the invention, comprising ramp controller 20, current source 22, and power amplifier 24. Ramp controller 20 is coupled to current source 22, and subsequently coupled to power amplifier 24.

When input signal Sin is to be amplified and output as output signal Sout in power amplifier 24, ramp controller 20 receives enable signal Sen to generate ramp signal Sramp, with slope direction thereof dependent on enable signal Sen. In an embodiment, ramp controller 20 generates ramp signal Sramp with ascending slope direction if enable signal Sen is switched from a logic "low" to a logic "high", descending slope direction if enable signal Sen is switched from a logic "high" to a logic "low". Other attributes of ramp signal Sramp including gradient, maximum magnitude, and waveform delay may be implemented in a fixed or programmable manner.

Current source 22 accepts ramp signal Sramp from ramp controller 20, thereby producing bias current Ibias. Bias current Ibias may correlate to ramp signal Sramp positively or negatively to form a ramp current.

Power amplifier 24 comprises supply voltage input Vsup coupled to fixed supply voltage VCC, obtains input signal Sin, and is biased by bias current Ibias to amplify input signal Sin such that an envelope of output signal Sout is a ramp, thus minimizing transient noise and spectral splatter.

Figure 3:
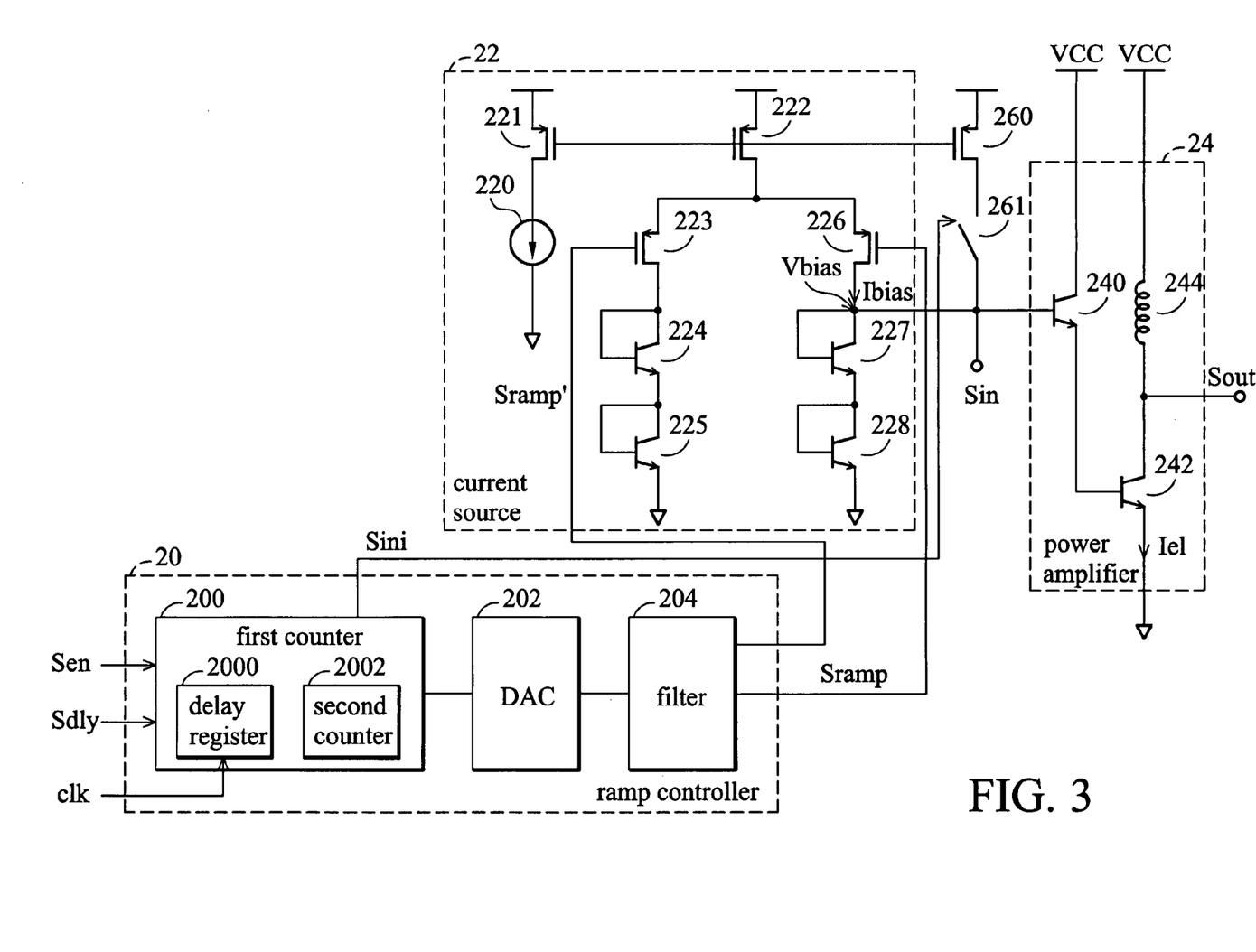
FIG. 3 is a circuit schematic of the power amplifier circuit in FIG. 2.

FIG. 3 is a circuit schematic of the power amplifier circuit in FIG. 2, wherein ramp controller 20 comprises first counter 200, Digital to Analog Converter (DAC) 202, and filter 204, current source 22 comprises constant current source 220, MOS 221, 222, 223, 226, and BJT 224, 225, 227, 228, MOS 260 and switch 261, power amplifier comprises BJT 240, 242 and inductor 244. First counter 200 is coupled to DAC 202, filter 204, subsequently to the gates of MOS 223 and 226. Constant current source 220 is coupled between the drain of MOS 221 and the ground. MOS 221, 222 and 260 are coupled together by the gates thereof, and the sources thereof are coupled to supply voltage VCC. The sources of MOS 223 and 226 are coupled to the drain of MOS 222, the drains thereof are coupled to the collectors of BJT 224 and 227 respectively. The bases of BJT 224, 225, 227, and 228 are coupled to the collectors thereto corresponding. The emitter of BJT 224 is coupled to the collector of BJT 225, the emitter of BJT 225 is coupled to the ground. The emitter of BJT 227 is coupled to the collector of BJT 228, the emitter of BJT 228 is coupled to the ground. The emitter of BJT 227 is also coupled to input signal Sin, the base of BJT 240, and switch 261, in turn coupled to the drain of MOS 260. BJT 240 is coupled to the base of BJT 242 with the emitter thereof, to supply voltage VCC with the collector. BJT 242 is coupled to inductor 244 with the collector thereof, and to the ground with the emitter. Inductor 244 is coupled to fixed supply voltage VCC.

When it is required to amplify input signal Sin, first counter 200 in ramp controller 20 receives enable signal Sen and clock signal clk and counts clock pulses of clock signal clk to establish a first count until reaching a target count. The first count may be a binary number and is a four-bit binary number in this embodiment. Upon detecting logic "low" to logic "high" transition in enable signal Sen, first counter 200 may count up from b'0000 to b'1111 to establish a ramp up signal, whereas for logic "high" to logic "low" transition in enable signal Sen, first counter 200 may count down from b'1111 to b'0000 for a ramp down signal. First counter 200 may further delay the first count for a predetermined duration stored in delay register 2000 by second counter 2002. Second counter 2002 counts clock pulses in clock signal clk to establish the predetermined duration in delay register 2000. The predetermined duration may be fixed or programmable through configuring delay register 2000 by delay signal Sdly.

DAC 202 obtains the first count from first counter 200, and converts the four-bit binary number of first count to analog ramp signal Sramp. DAC 202 may be a differential DAC generating a differential signal pair of ramp signal Sramp and reverse ramp signal Sramp'. If the first count is a count-up binary number, DAC 202 produces upwards staircase signal Sramp and downwards staircase signal Sramp' accordingly. If the first count is a count-down binary number, DAC 202 produces downwards staircase signal Sramp and upwards staircase signal Sramp'.

Filter 204 receives and smoothes the staircase signals of the differential signal pair from DAC 202 to output a differential signal pair of ramp-up and ramp-down signals.

Current source 22 receives ramp signal Sramp and reverse ramp signal Sramp' from filter 204 to control current source pair MOS 226 and 223, so that as one is turned on, the other is turned off gradually. Constant current source 220 provides a reference current to be mirrored to other current branches through current mirror MOS 221, 222 and 260, and MOS 222 supplies a constant current to be distributed to current source pair MOS 226 and 223. BJT 224 and 225 are diode connected to establish a fixed diode voltage across the collector to the emitter each, resulting in a fixed voltage at the collector of BJT 224 when both are turned on. Similarly there is fixed voltage Vbias at the collector of BJT 227 when BJT 227 and 228 are turned on. Upon receiving ramp-up signal Sramp at the gate of MOS 226 and ramp-down signal Sramp' at the gate of MOS 223, MOS 226 is turned on gradually to provide bias current Ibias with an increasing ramp, and MOS 223 is turned off so that the drain current thereof has a decreasing ramp.

The collectors of BJT 240 and 242 are supplied by fixed supply voltage VCC. The base of BJT 240 in power amplifier 24 is biased by bias current Ibias at fixed voltage Vbias, so that emitter current Ie1 varies with bias current Ibias, resulting in output signal Sout with a ramp corresponding to the varying emitter current Ie1 Input signal Sin is modulated into the bias current Ibias to control the envelop edge of output signal Sout to be a ramp, thus reducing transient noise and spectral splatter. Switch,261 is controlled by preset signal Sini from first counter 200, to be switched to speed up the ramp at output signal Sout when required.

Figure 4:
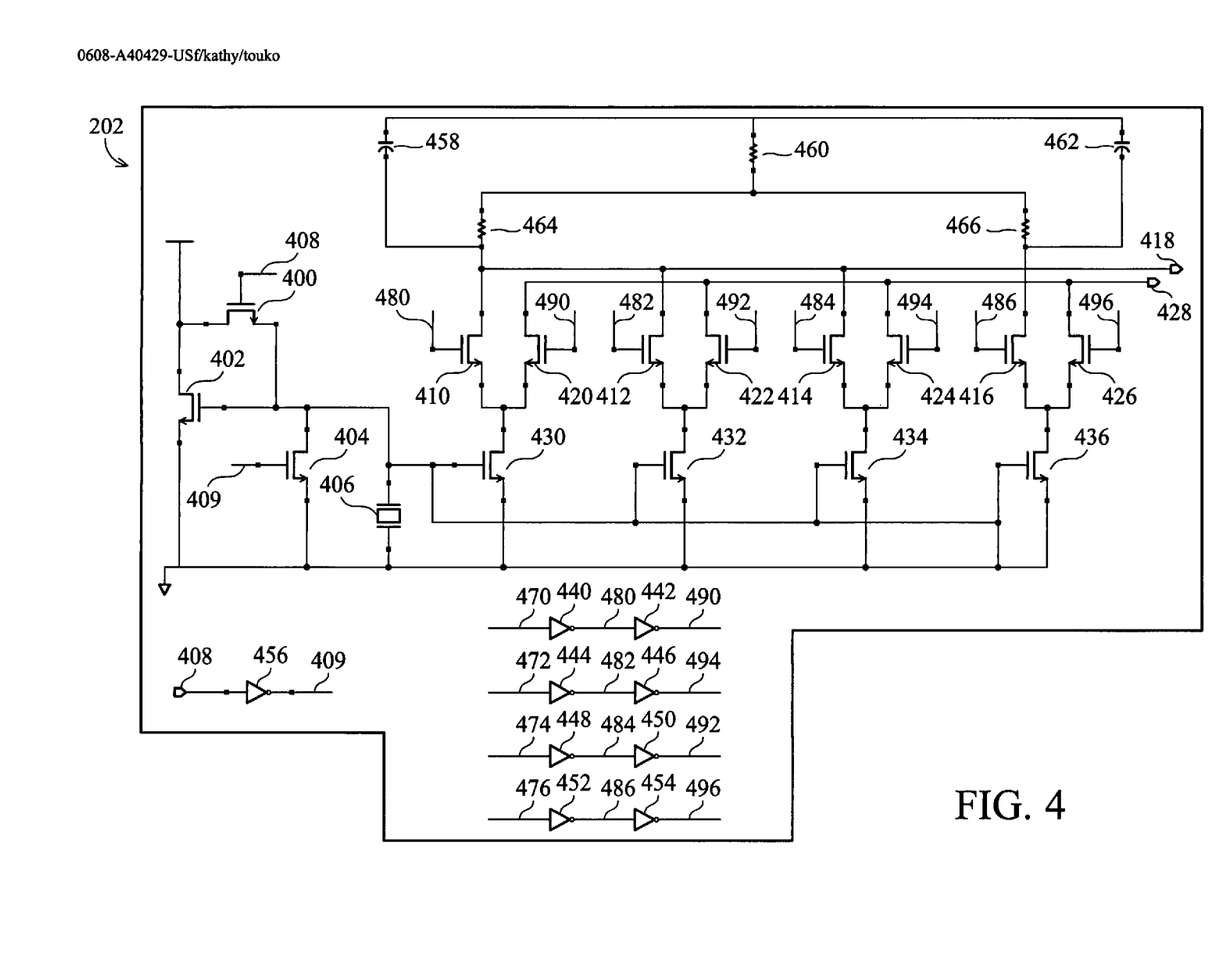
FIG. 4 is a schematic diagram of an exemplary differential DAC to be incorporated into FIG. 3.

FIG. 4 is a schematic diagram of an exemplary differential DAC to be incorporated into FIG. 3, comprising MOS 400, 402, 404, 410, 412, 414, 416, 420, 422, 424, 426, 430, 432, 434, 436, inverter 440, 442, 444, 446, 448, 448, 450, 452, 454, 456, capacitor 458, 462, and resistor 460, 464, 466.

DAC inputs 470, 472, 474, and 476 receives each bit of the four-bit first count from first counter 200 respectively, producing reverse bits 480, 482, 484, 486 and non-reverse bits 490, 492, 494 and 496. As the first count ramps up, DAC inputs 470, 472, 474, and 476 receives logic "high" in turn, turning off reverse bits 480, 482, 484, 486 and turning on non-reverse bits 490, 492, 494 and 496 accordingly. Consequently MOS 420, 422, 424, and 426 are switched on in sequence by non-reverse bits 490, 492, 494 and 496, establishing an upwards staircase signal at output 428 as ramp signal Sramp. Likewise MOS 410, 412, 414, 416 are switched off sequentially by reverse bits 480, 482, 484, and 486, resulting in a downwards staircase signal at output 418 as reverse ramp signal Sramp'.

Figure 5:
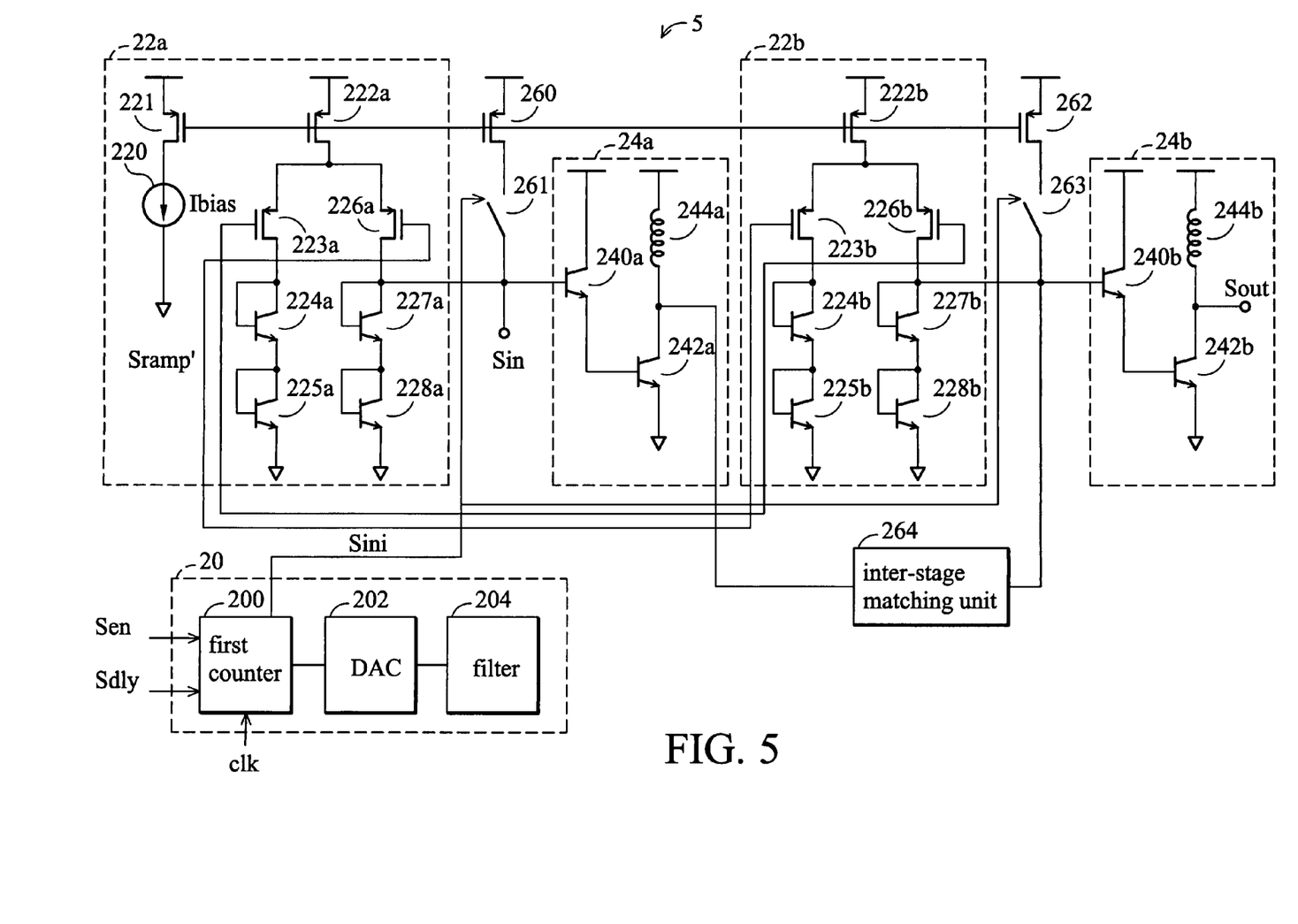
FIG. 5 is a schematic diagram of an exemplary power amplifier circuit of the invention.

FIG. 5 is a schematic diagram of an exemplary two-stage power amplifier circuit of the invention, comprising the power amplifier circuit in FIG. 4, second current source 22b, MOS 262, switch 263, inter-stage matching unit 264, and second power amplifier 24b. Second current source 22b, is coupled to switch 263, the drain of MOS 262, and second power amplifier 24b in a similar manner as in power amplifier circuit 2 in FIG. 4, except the collector of BJT 242a (the output signal) in first amplifier stage 24a is coupled to switch 263 through inter-stage matching unit 264.

The output signal from first amplifier stage 24a is amplified again in second amplifier 24b to produce final output signal Sout with a ramp envelope by a similar principle disclosed in the power amplifier circuit in FIG. 4.

While a two-stage power amplifier circuit is disclosed in FIG. 5, multiple-stage power amplifier circuit may also be incorporated by a similar principle, those skilled in the art may make circuit modification as appropriate.

Figure 6:
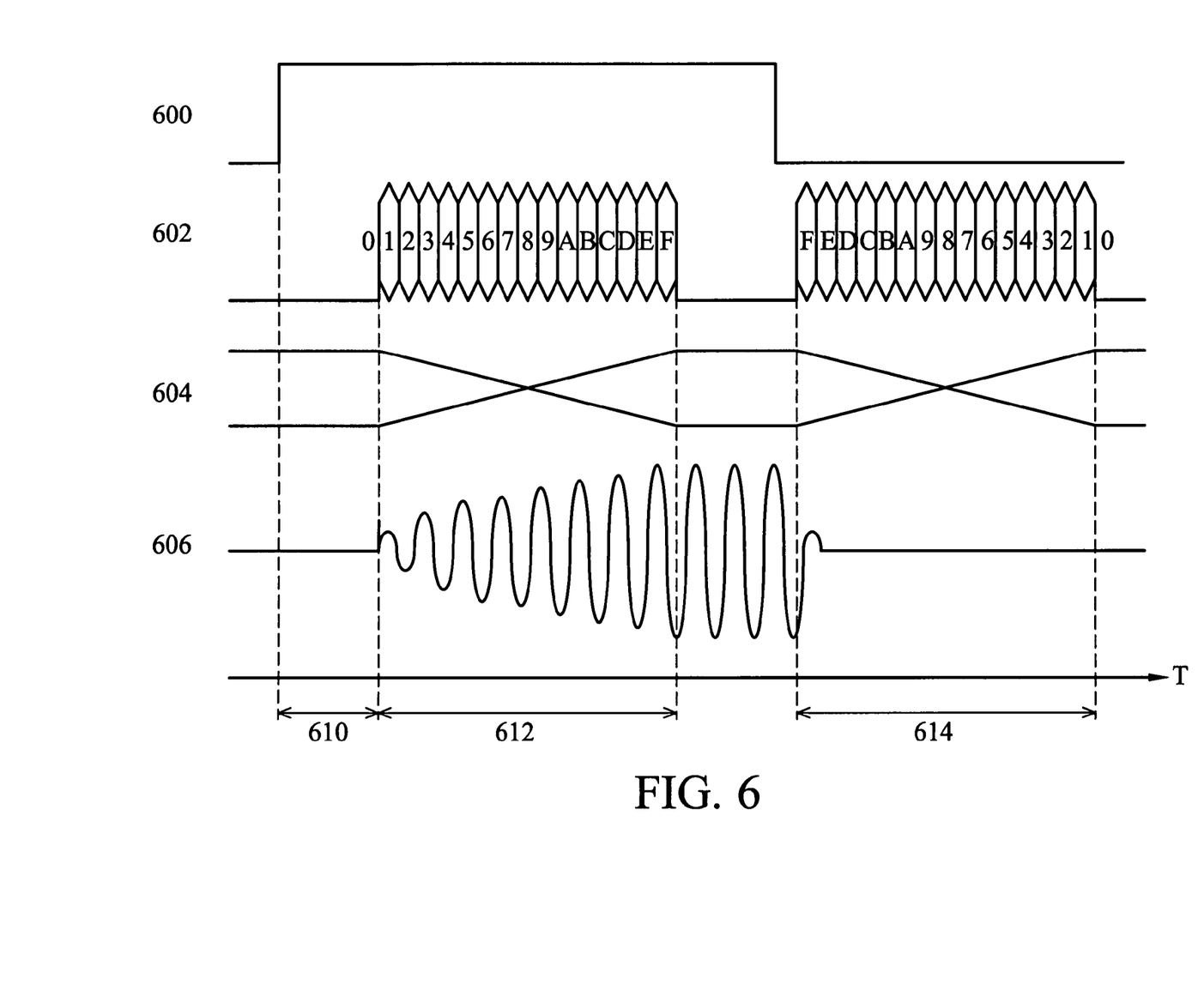
FIG. 6 is a timing diagram of selected signals in the power amplifier circuit in FIG. 3.

FIG. 6 is a timing diagram of selected signals in the power amplifier circuit in FIG. 3, comprising enable signal Sen 600, the first count 602, the differential signal pair 604, output signal Sout 606, predetermined duration 610, ramp-up duration 612, and ramp-down duration 614.

As enable signal Sen 600 switches from logic "low" to logic "high", first counter 200 delays the predetermined duration 610 then counts up from h'0 to h'F as the first count, converted by DAC 202 and smoothed by filter 204 to the differential signal pair 604 including ramp-up ramp signal Sramp and ramp-down reverse signal Sramp'. Subsequently ramp signal Sramp turns MOS 226 on to produce ramp-up bias current Ibias, combined with sinusoidal input signal Sin to result in output signal Sout 606 having a ramp-up envelope in ramp-up duration 612. As enable signal Sen 600 switches from logic "high" to logic "low", first counter 260 counts down from h'F to h'0, converted to the differential signal pair 604 including ramp-down ramp signal Sramp and ramp-up reverse signal Sramp', in turn producing ramp-down bias current Ibias and outputting output signal Sout having ramp-down envelope in ramp-down duration 614.

A method of amplifying input signal Sin to output signal Sout according to the invention, incorporating the power amplifier circuit in FIG. 3 and FIG. 5, the method comprises receiving enable signal Sen to generate ramp signal Sramp in ramp controller 20, producing ramp current Ibias by ramp signal Sramp in current source 22, coupling a first supply voltage input of first power amplifier 24 to a fixed supply voltage, and biasing first power amplifier 24 with ramp current Ibias such that the envelope of output signal Sout is a ramp.

In an embodiment, the receiving step comprises counting the first count with input clock clk by first counter 200, and converting the first count to ramp signal Sramp by ADC 202. In another embodiment, ADC 202 is a differential ADC converting the first count to the differential signal pair of ramp signal Sramp and inverse ramp signal Sramp'.

In some embodiments, the method further comprises delaying the first count for the predetermined duration by second counter 2602. The predetermined duration is programmable by delay signal Sdly to be stored in delay register 2000 in first counter 200.

The method may further comprise smoothing the ramp signal from ADC 202 in filter 204, resulting in the differential signal pair with smooth ramp-up and ramp-down slope.

The method may further comprise coupling the second supply voltage input of second power amplifier 24b to fixed supply voltage VCC, and biasing second power amplifier 24 with bias current Ibias from second current source 22b, such that the envelope of a second output signal is also a ramp.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A power amplifier circuit amplifying an input signal to an output signal, comprising:
   a ramp controller, receiving an enable signal to generate a ramp signal;
   a current source coupled to the ramp controller, producing a ramp current by the ramp signal; and
   a first amplification stage coupled to the current source, comprising a first supply voltage input coupled to a fixed supply voltage, biased by the ramp current to amplify the input signal such that an envelope of the output signal is a ramp; and
   wherein the ramp controller comprises:
   a first counter receiving the enable signal and counting a first count with an input clock; and
   a digital to analog converter (DAC) coupled to the first counter and the current source, and converting the first count to the ramp signal.

2. The power amplifier circuit of claim 1, wherein the DAC converts the first count to a differential signal pair of the ramp signal and an inverse ramp signal.

3. The power amplifier circuit of claim 1, wherein the first counter further delays the first count for a predetermined duration.

4. The power amplifier circuit of claim 3, wherein the first counter further comprises a second counter counting the predetermined duration.

5. The power amplifier circuit of claim 3, wherein the first counter further comprises a delay register and the predetermined duration is stored therein.

6. The power amplifier circuit of claim 1, wherein the ramp controller further comprises a filter coupled to the DAC, smoothing the ramp signal.

7. The power amplifier circuit of claim 1, further comprising a second amplification stage coupled to the current source and the first amplification stage, comprising a second supply voltage input coupled to the fixed supply voltage, biased by the ramp current to amplify the output signal such that an envelope of a second output signal is a ramp.

8. A method of amplifying an input signal to an output signal, comprising:
   receiving an enable signal to generate a ramp signal;
   producing a ramp current by the ramp signal;
   coupling a first supply voltage input of a first amplification stage to a fixed supply voltage; and
   biasing the first amplification stage with the ramp current such that an envelope of the output signal is a ramp; and
   wherein the receivinci step comprises:
   counting a first count with an input clock by a first counter upon reception of the enable signal; and
   converting the first count to the ramp signal.

9. The method of claim 8, wherein the converting step comprises converting the first count to a differential signal pair of the ramp signal and an inverse ramp signal.

10. The method of claim 8, further comprising delaying the first count for a predetermined duration.

11. The method of claim 10, wherein the delaying step comprises counting the predetermined duration by a second counter.

12. The method of claim 10, wherein the first counter further comprises a delay register and the predetermined duration is stored therein.

13. The method of claim 8, further comprising smoothing the ramp signal in a filter.

14. The method of claim 8, further comprising:
coupling a second supply voltage input of a second amplification stage to the fixed supply voltage; and
biasing the second amplification stage with the ramp current such that an envelope of a second output signal is a ramp.

* * * * *